United States Patent [19]

Scifres et al.

[11] Patent Number: 4,882,734
[45] Date of Patent: Nov. 21, 1989

[54] QUANTUM WELL HETEROSTRUCTURE LASERS WITH LOW CURRENT DENSITY THRESHOLD AND HIGHER $T_O$ VALUES

[75] Inventors: Donald R. Scifres, Los Altos Hills, Calif.; Robert D. Burnham, Wheaton, Ill.

[73] Assignee: Xerox Corporation, Stamford, Conn.

[21] Appl. No.: 165,862

[22] Filed: Mar. 9, 1988

[51] Int. Cl.[4] .............................................. H01S 3/19
[52] U.S. Cl. ........................................................ 372/45
[58] Field of Search ............... 372/45, 46, 44; 357/16, 357/17

[56] References Cited

U.S. PATENT DOCUMENTS

| | | | |
|---|---|---|---|
| 4,328,496 | 5/1982 | Scifres et al. | 372/45 |
| 4,512,022 | 4/1985 | Tsang | 372/45 |
| 4,602,370 | 7/1986 | Tsang | 372/45 |
| 4,630,083 | 12/1986 | Yamakoshi | 357/17 |
| 4,671,830 | 6/1987 | Burnham | 372/45 |
| 4,787,089 | 11/1988 | Hayakawa et al. | 372/45 |
| 4,794,611 | 12/1988 | Hara et al. | 372/45 |

OTHER PUBLICATIONS

G. H. B. Thompson et al., "(GaAl)As Lasers with a Heterostructure for Optical Confinement and Additional Heterojunctions for Extreme Carrier Confinement", *IEEE Journal of Quantum Electronics*, vol. QE-9(7), pp. 311-317, Feb., 1973.

T. Hayakawa et al., "Low Current AlGaAs Visible Laser Diodes with an (AlGaAs)m(GaAs)n Superlattice Quantum Well", *Applied Physics Letters*, vol. 49(11), pp. 636-638, Sep. 15, 1986.

P. L. Derry et al., "Ultralow-Threshold Graded-Index Separate-Confinement Single Quantum Well Buried Heterostructure (Al,Ga)As Lasers with High Reflectivity Coatings", *Applied Physics Letters*, vol. 50(25), pp. 1773-1775, Jun. 22, 1987.

S. D. Hersee et al., "Very Low Threshold GRIN-SCH GaAs/GaAlAs Laser Structure Grown by OM VPE", *Electronics Letters*, vol. 18(20), pp. 870-871, Sep. 30, 1982.

S. D. Hersee et al., "Low-Threshold GRIN-SCH GaAs/GaAlAs Laser Structure Grown by OM VPE", *Electronics Letters*, vol. 18(14), pp. 618-620, Jul. 8, 1982.

J. R. Shealy, "Optimizing the Performance of AlGaAs Graded Index Separate Confining Heterostructure Quantum Well Lasers", *Applied Physics Letters*, vol. 50(23), pp. 1634-1636, Jun. 8, 1987.

J. Nagle et al., "Threshold Current of Single Quantum Well Lasers: The Role of the Confining Layers", *Applied Physics Letters*, vol. 49(20), pp. 1325-1327, Nov. 17, 1986.

K. Fujiwara et al., "Improved Recombination Lifetime of Photoexcited Carriers in GaAs Single Quantum Well Heterostructures Confined by GaAs/AlAs Short-Period Superlattics", *Applied Physics Letters*, vol. 49(18), pp. 1193-1195, Nov. 3, 1986.

*Primary Examiner*—James W. Davie
*Attorney, Agent, or Firm*—W. Douglas Carothers, Jr.

[57] ABSTRACT

A quantum well heterostructure laser has low current density threshold and high $T_O$ values and includes a plurality of contiguous semiconductor layers formed on a substrate wherein one or more the layers form an active region capable of quantization of electron states. The active region is confined by a pair of outer superlattice regions which provide optical confinement and low thermal resistance while preventing the development of antiwaveguiding properties. Many configurations are shown to demonstrate the many forms that the overall laser structure can take and, in particular, the nature of the outer or inner cladding regions of different superlattice geometries and forms.

16 Claims, 8 Drawing Sheets

QUANTUM WELL HETEROSTRUCTURE LASERS WITH LOW CURRENT DENSITY THRESHOLD AND HIGHER $T_O$ VALUES

BACKGROUND OF THE INVENTION

This invention relates generally to semiconductor lasers and more particularly to such lasers having a modified active region and/or adjacent cladding regions to provide for lower thermal resistance, improved optical confinement, improved optical confinement, lower series resistance and beam width control.

Over the past several years, there have been improvements made in the threshold current density of single and multiple quantum well (SQW & MQW) heterostructure semiconductor lasers as well as an increase in $T_0$, which has been a traditional indicator of threshold/temperature dependence in laser operation. High values of $T_0$ correspond to low sensitivity of laser current threshold to operating temperature. These improvements have been made in such quantum well lasers by first providing separate confinement heterostructure quantum well laser (SCH QW) structures having a single quantum well (SQW) or multiple quantum well (MQW) active region (See, for example, the article of Thompson et al "(GaAl)As Lasers With a Heterostructure for Optical Confinement and Additional heterojunctions for Extreme Carrier Confinement", *IEEE Journal Of Quantum Electronics*, Vol. QE-9, pp. 311-3, (1973) and USPs 4,328,469 and 4,602,370), followed by graded index (SCH SQW or MQW separate confinement heterostructures quantum well lasers (GRIN SCH QW) having a (1) parabolic graded function or (2) linearly graded function or (3) stair step graded function or (4) barrier thickness graded function in the cladding layers adjacent to the active region. Examples of these four types of graded index cladding region profiles are respectively found in:

(1) U.S. Pat. Nos. 4,512,022 Tsang and 4,630,083 to Yamakoshi; T. Hayakawa et al, "Low Current Threshold AlGaAs Visible Laser Diodes With An $(AlGaAs)_m(GaAs)_n$ Superlattice Quantum Well", *Applied Physics Letters*, Vol. 49(11), pp. 636-638, Sept. 15, 1986; and P. L. Derry et al, "Ultralow-Threshold Graded-Index Separate-Confinement Single Quantum Well Buried Heterostructure (Al,-Ga)As Lasers With High Reflectivity Coatings", *Applied Physics Letters*, Vol. 50(25), pp. 1773-1775, Jun. 22, 1987.

(2) S. D. Hersee et al, "Very Low Threshold GRIN-SCH GaAs/GaAlAs Laser Structure Grown By OM VPE", *Electronics Letters*, Vol. 18(20), pp. 870-871, Sept. 30, 1982.

(3) S. D. Hersee et al, "Low-Threshold GRIN-SCH GaAs/GaAlAs Laser Structure Grown By OM VPE", *Electronics Letters*, Vol. 18(14), pp. 618-620, Jul. 8, 1982.

(4) J. R. Shealy, "Optimizing the Performance of AlGaAs Graded Index Separate Confining Heterostructure Quantum Well Lasers, *Applied Physics Letters*, Vol. 50(23), pp. 1634-1636, Jun. 8, 1987.

It is a principal object of this invention to provide improved current density threshold structures independent of waveguide parameters with a better degree of beam width control, improved higher thermal conductivity and lower sensitivity to temperature with attendant improved lifetime and higher catastrophic damage levels.

SUMMARY OF THE INVENTION

According to this invention, a quantum well heterostructure laser has low current density threshold and high $T_0$ values and includes a plurality of contiguous semiconductor layers formed on a substrate wherein one or more the layers form an active region capable of quantization of electron states. The active region is confined by a pair of outer superlattice regions which provide optical confinement and low thermal resistance while preventing the development of antiwaveguiding properties. Many configurations are presented in order to demonstrate the many forms that the overall laser structure can take and, in particular, the nature of the outer or inner cladding regions of different superlattice geometries and forms. For example, outer superlattice regions may have a modulated grading in compositional value between minimum and maximum values, the transition energy levels of said outer superlattice regions being higher than the lowest transition energy levels exhibited by said active region. These superlattices may have a high period of frequency comprising alternating layers of wells and barriers, e.g., 30–100 layers, wherein each layer has a thickness in the range of 20Å–300Å with preferred thickness in excess of 50Å for improved thermal properties. The outer superlattice regions may further be linearly graded in overall refractive index via a monotonic compositional change from a minimum value adjacent to the active region to a maximum value at the outer limits of the outer cladding layers.

In another embodiment, the outer superlattice regions may be sawtooth shaped having a modulated grading in refractive index between maximum and minimum values of continually varying compositional content while simultaneously linearly graded in overall refractive index via a monotonic compositional change from a minimum value adjacent to the active region to a maximum value at the outer limits of the outer cladding layers.

The active region may be comprised of a single quantum well, a multiple quantum well or a superlattice having a sawtooth shaped with a modulated grading in refractive index between maximum and minimum values of continually varying compositional content.

The compositional variance or change may be comprised of per cent changes of Al in the GaAs/GaAlAs regime which can be brought about during computer controlled MO-CVD growth.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

The following described figures relate to energy profiles for the conduction band of semiconductor heterostructures useful in carrier confinement and optical waveguiding and confinement in semiconductor lasers. The principal aspect of these structures is optical confinement with lower thermal conductivity and thermal resistance and higher $T_0$. They also have applicability to other semiconductor device and structures such as, waveguide structures for on-chip optical communication or III-V transistor devices. They further have the advantage that lower electrical series resistance can be realized leading to higher power conversion efficiency.

While the description relates to the illustrations of structures via energy band profiles, it should be understood, as is known in the art, that these profiles are also analogous to compositional profiles for the same structures. Thus, the figures are also referenced to compositional values as well as being representative of the energy band profile for the structure.

Figure 1:
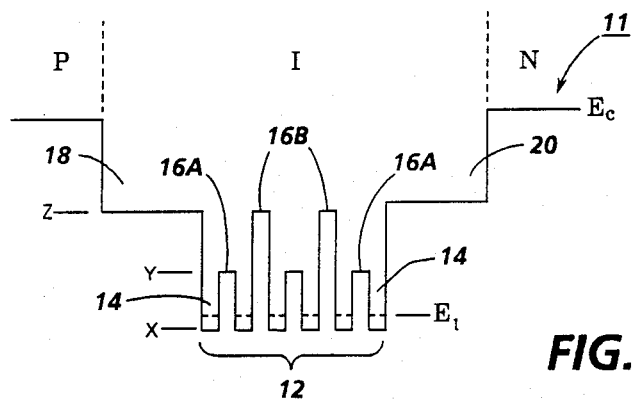
FIG. 1 is an energy band profile configuration for a separate confinement heterostructure (SCH) MQW structure having alternating barrier heights.

The structures shown are fabricated by conventional MO-CVD techniques. The modulation and graded changes in compositional value, i.e., modulated and graded changes in GaAlAs during growth is accomplished under computer control. Reference is now made to FIG. 1 illustrating an energy band profile configuration for a separate confinement heterostructure multiple quantum well (SCH MQW) structure 10. Structure 10 contains an active region having a superlattice 12 of several quantum wells 14 separated by barriers 16A and 16B of alternating height. As is known in the art, wells 14 may be comprises of GaAs or $Ga_{1-x}Al_xAs$, where x is a small value, and barriers 16A and 16B may, respectively, comprise $Ga_{1-y}Al_yAs$ and $Ga_{1-z}Al_zAs$ where $Z>Y>X$. Separate confinement is provided by inner cladding layers 18 and 20 of $Ga_{1-z}Al_zAs$ for the purpose of optical waveguiding of the propagating radiation. Superlattice 12 is preferably symmetrical in the waveguide as defined by region 12 and layers 18 and 20.

In FIG. 1, the electron energy, $E_1$, is preferentially below level Y, although operation can also be achieved below Z. Because of the lower bandgap of barriers 16A vis a vis barriers 16B, the thermal conductivity of barriers 16A is lower than barriers 16B thereby providing improved thermal properties. Electron capture in the wells, however, is aided by the higher bandgap of barriers 16B. Thus, by the combination of two barrier heights as exemplified in FIG. 1, the improvements in lower thermal conductivity and thermal resistance and higher $T_0$ can be achieved.

Figure 2:
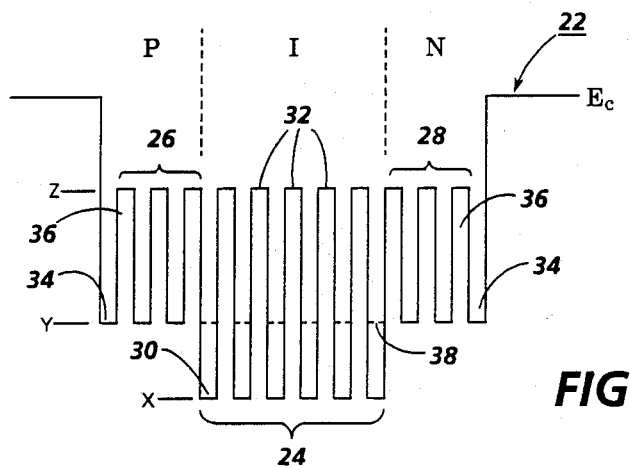
FIG. 2 is an energy band profile configuration for a SCH MQW structure having superlattices in the cladding regions.

In FIG. 2, energy band profile shown comprises a SCH MQW structure 22 having an active region superlattice 24 confined by superlattices in inner cladding regions 26 and 28. Active wells 30 may be comprised of GaAs or $Ga_{1-x}Al_xAs$, where x is a small value, and barriers 32 may be $Ga_{1-z}Al_zAs$ where $z>x$ or equal to 1. Cladding superlattice regions 26 and 28 comprise wells 34 of $Ga_{1-y}Al_yAs$ and barriers 36 of $Ga_{1-z}Al_zAs$ where $z>y>x$. In structure 22, it is preferred that cladding superlattice wells 34 be of smaller width than active region wells 30 in order that there not be an inordinate amount of light absorbed in cladding regions 26 and 28. However, in embodiment as shown where wells 30 and 34 are of about equal thickness, any transition energy active in superlattice 24 above the energy transition lines 38 would be absorbed while transition energy below lines 38 would not be absorbed in cladding superlattice regions 26 and 28 since the transition energy level in these cladding regions is higher. In this case, cladding regions 26 and 28 offer reduced thermal resistance and reduced electrical resistance particularly if the bandgap of the crystal is near the direct/indirect gap crossover or in a range equivalent to a 50% alloy composition.

In superlattice cladding regions 26 and 28, wells 34 and barriers 56 of GaAlAs may be y and z in the range between 0.30 to 0.70. However, as indicated in the article of T. Yao, "Thermal Properties of AlAs/GaAs Superlattices", *Applied Physics Letters*, Vol. 51(22), pp. 1798–1800, Nov. 30, 1987, improved thermal properties, e.g., reduced thermal resistance, can be obtained by AlAs/GaAs superlattices vis a vis a GaAlAs alloy. This is particularly true where the equivalent alloy mix is 50% Ga and Al. In the case of the 50% GaAlAs alloy, the thermal conductivity is at its worst or highest value. By providing GaAs/AlAs superlattices at regions 26 and 28, a 50% averaging of Ga to Al is achieved with improved thermal properties. With P-type and N-type doping of regions 26 and 28, improved electrical properties are obtained in that low electrical series resistance is realized leading to better power conversion efficiency. Also, unwanted carrier injection in superlattice cladding regions 26 and 28 is avoided by doping of these regions and/or positioning the P-N junction of structure 22 in the confines of active region 24. Lastly, it is preferred that, in the case of GaAs/AlAs superlattices utilized in cladding region 26 and 28, that the thickness of the GaAs layers 34 be approximately 60Å due to the achievement of the resident phonon effect which facilitates heat transfer in structure 22.

The foregoing conditions and attributes are equally applicable to the remaining embodiments in this application relative to features of the superlattice cladding regions of such heterostructures, as indicated more specifically later.

Figure 3:
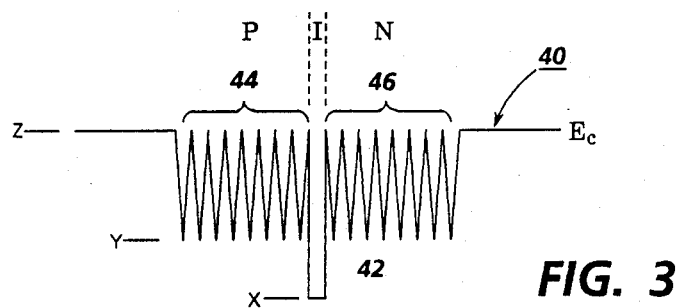
FIG. 3 is an energy band profile configuration for a SQW structure having sawtooth superlattices in the cladding regions.

In FIG. 3, there is illustrated an energy band profile configuration for a single quantum well (SQW) structure 40 having a quantum well 42 bounded on both sides by sawtooth superlattice cladding regions 44 and 46 providing regions of modulated but overall averaging compositional value. Well 42 may be comprised of GaAs or $Ga_{1-x}Al_xAs$ where x is a small value and waveguide regions 44 and 46 are a modulated in compositional value between maximum and minimum values from $Ga_{1-y}Al_yAs$ to $Ga_{1-z}Al_zAs$ where $z>y>x$.

The purpose of cladding regions in the embodiments of FIGS. 2 and 3, as well as in embodiments yet to be explained, is to provide cladding regions having improved control of the width of the output beam of the laser with a beam of narrow waist and low divergence as well as to adjust for such waveguide parameters independent of electrical parameters of the laser.

Figure 4:
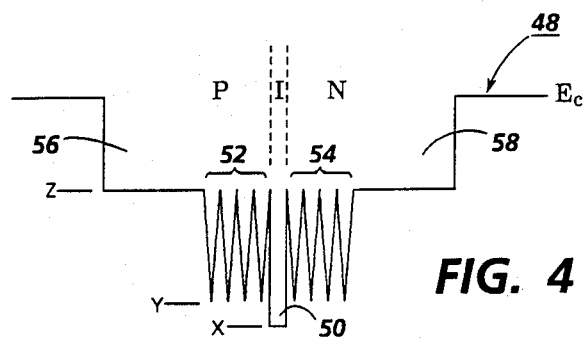
FIG. 4 is an energy band profile configuration similar to FIG. 3 except in a separate confinement configuration.

In FIG. 4, SQW structure 48 is substantially similar to structure 40 of FIG. 3 except that separate confinement is provided via outer cladding layers 56 and 58. Structure 48 comprises quantum well 50 bounded on both sides by inner sawtooth superlattice cladding regions 52 and 54 providing regions of modulated but overall averaging compositional value. Separate confinement layers 56 and 58 for optical waveguiding may be composed of $Ga_{1-z}Al_zAs$. Well 50 may be comprised of GaAs or $Ga_{1-x}As$, where x is a small value and sawtooth SL regions 52 and 54 are modulated in a compositional value refractive index between maximum and minimum values from $Ga_{1-y}Al_yAs$ to $Ga_{1-z}Al_zAs$ where $z>y>x$.

Figure 5:
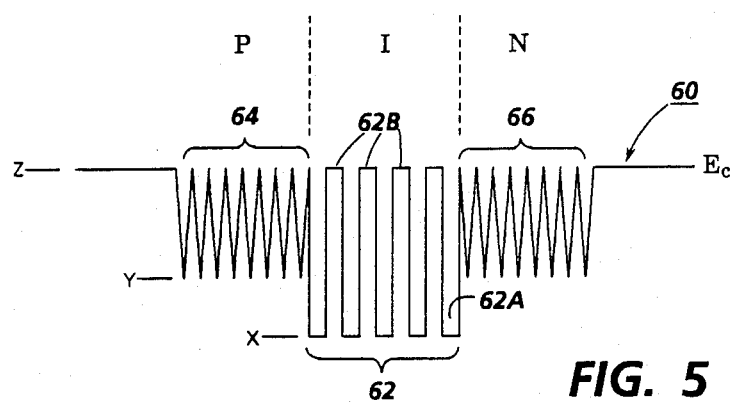
FIG. 5 is an energy band profile configuration for a MQW structure having sawtooth superlattices in the cladding regions.

FIG. 5 illustrates an energy band profile configuration for a multiple quantum well (MQW) structure 60 having a multiple quantum well superlattice 62 bounded on both sides by sawtooth superlattice cladding regions 64 and 66 providing cladding regions of modulated but overall averaging compositional value. Superlattice 62 may comprise wells 62A of GaAs or $Ga_{1-x}Al_xAs$, where x is a small value and waveguide regions 64 and 66 are modulated in compositional value between maximum and minimum values from $Ga_{1-y}Al_yAs$ to $Ga_{1-z}Al_zAs$ where $z>y>x$.

Figure 6:
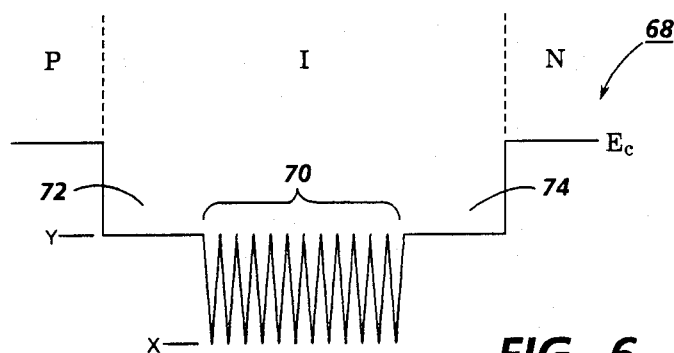
FIG. 6 is an energy band profile configuration for a separate confinement heterostructure (SCH) MQW structure having a sawtooth superlattice active region.

FIG. 6 illustrates an energy band profile for a SCH MQW structure 68 having a sawtooth superlattice active region 70 comprising a modulated in compositional value between maximum and minimum values from GaAs or $Ga_{1-x}Al_xAs$ to $Ga_{1-y}Al_yAs$ where $y>x$. Separate confinement layers 56 and 58 for optical waveguiding may be comprised of $Ga_{1-y}Al_yAs$.

Figure 7:
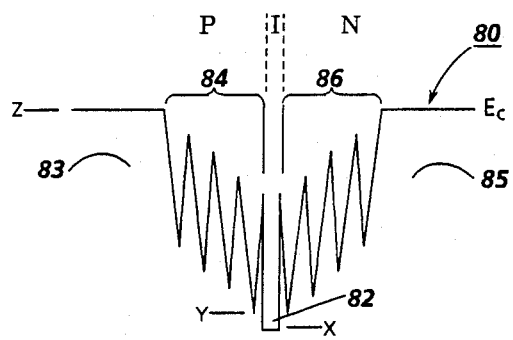
FIG. 7 is an energy band profile configuration for a SQW structure having compositional graded index sawtooth superlattices (COMP GRIN SATH SL) in the cladding regions.

In FIG. 7, there is shown a modified form of structure 40 in FIG. 3. SQW structure 80 comprises a quantum well 82 bounded on both sides by a compositional graded index sawtooth superlattice (COMP GRIN SATH SL) forming cladding regions 84 and 86. Regions 84 and 86 have a modulated grading in refractive index between maximum and minimum values of continually varying compositional content and simultaneously being linearly graded overall in refractive index value via compositional change from a minimum value adjacent to central well 82 and monotonically increasing to a maximum value adjacent to cladding layers 83 and 85. Well 82 may be comprised of GaAs or $Ga_{1-x}Al_xAs$, where x is a small value and COMP GRIN SATH SL regions 84 and 86 may have a linear grading between minimum and maximum values from $Ga_{1-y}Al_yAs$ to $Ga_{1-z}Al_zAs$ where $z>y>x$ with a modulated minimum and maximum between y and z. SL regions 84 and 96 may alternatively be provided with a larger or smaller modulated period compared to that illustrated in FIG. 7.

Figure 8:
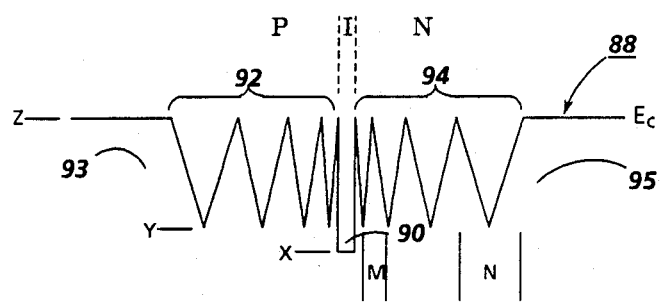
FIG. 8 is an energy band profile configuration for a SQW structure having thickness graded index sawtooth superlattices (THCK GRIN SATH SL) in the cladding regions.

In FIG. 8, there is shown another modified form of structure 40 in FIG. 3. SQW structure 88 comprises a quantum well 90 bounded on both sides by a thickness graded index sawtooth superlattice (THCK GRIN SATH SL) forming cladding regions 92 and 94. Regions 92 and 94 have a modulated grading in refractive index between maximum and minimum values of varying compositional content and simultaneously being linearly graded in overall refractive index value via increasing thickness change, i.e., increase in the modulated period from a minimum period adjacent to well 90 to a maximum period at cladding layers 93 and 95. Well 90 may be comprised of GaAs or $Ga_{1-x}Al_xAs$ where x is s small value and THCK GRIN SATH SL regions 92 and 94 may have an increasing modulated period change between minimum and maximum period values of M and N. SL regions 92 and 94 may also be alternatively provided with a modulated in compositional value.

The structures of FIGS. 3-8 must be designed so that the GRIN SATH SL regions do not have a potentially low average index value which will be antiwaveguiding or absorbing to the propagating radiation. In this connection, these regions should have an overall higher average Al content. Also, the sawtooth regions provide for a single selected wavelength or, at the most, a very narrow wavelength emission spectrum, with good wavelength guiding properties. The selection of wavelength is dependent on the average compositional content, e.g. the per cent amount of Al content in the ternary alloy, GaAlAs, present in these regions. Care must be taken such that in the case of all embodiments having modulated cladding layers, that the modulated layers be heavily doped and/or the well thickness in those layers be less (e.g., 20Å or less) than that of the well or wells in the p-n junction in the active region in order to avoid injection carrier capture in the modulated cladding layers, i.e., to avoid electron capture outside the intended recombination active region of the device. This is true, for example, for the embodiments shown in FIGS. 2-5, 7-13, 15, 19-23.

Figure 9:
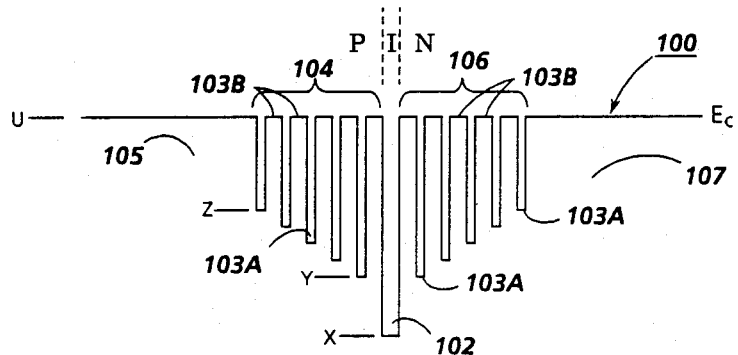
FIG. 9 is an energy band profile configuration for a SQW structure having compositional graded index superlattices (COMP GRIN SL) in the cladding regions.

Reference is now made to FIG. 9 illustrating an energy band profile configuration for a SQW structure 100 having a central quantum well 102 bounded by compositional graded index superlattices (COMP GRIN SL) forming cladding regions 104 and 106. The cladding wells 103A of SL regions 104 and 106 are linearly graded in compositional change from a minimum value adjacent to well 102 to a maximum value at outer cladding layers 105 and 107. Well 102 may be comprised of GaAs or $Ga_{1-x}Al_xAs$, where x is a small value and COMP GRIN SL regions 104 and 106 may have a linear or monotonic grading increase from $Ga_{1-y}Al_yAs$ to $Ga_{1-z}Al_zAs$ where $z>y>x$. Cladding layers 105 and 107 as well as the cladding barriers 103B of SL regions 104 and 106 may be comprised of $Ga_{1-z}Al_zAs$. Regions 104 and 106, therefore, have a partially modulated grading in refractive index between maximum and minimum values of varying compositional content where the refractive index is greatest adjacent to well 102, but not as high as that of well 102, and progressively decreases in value to outer cladding layers 105 and 107.

Figure 10:
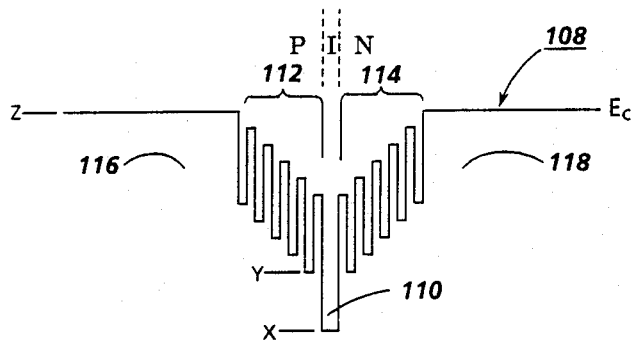
FIG. 10 is an energy band profile configuration for another embodiment of a SQW structure having compositional graded index superlattices (COMP GRIN SL) in the cladding regions.

In FIG. 10, the energy band profile configuration for a COMP GRIN SL SQW structure 108 shown is similar to structure 100 of FIG. 9 except that there is full modulated grading in compositional value for both wells and barriers comprising inner cladding regions 112 and 114. In this connection, structure 108 is also similar to structure 80 shown in FIG. 7 except cladding regions 84 and 86 are continuously, monotonically varied in compositional content as well as modulated in compositional content.

In particular, SQW structure 108 comprises a quantum well 110 bounded by compositional graded index superlattices (COMP GRIN SL) forming cladding regions 112 and 114. Regions 112 and 114 have modulated grading in refractive index between maximum and minimum values of varying compositional content and concurrently being monotonically increased in compositional value from a minimum value adjacent to well 110 to a maximum value at cladding layers 116 and 118. Well 110 may be comprised of GaAs or $Ga_{1-x}Al_xAs$, where x is a small value and COMP GRIN SL regions 112 and 114 may have a monotonic grading change between minimum and maximum values from $Ga_{1-y}Al_yAs$ to $Ga_{1-z}Al_zAs$ where $z>y>x$ with a modulated minimum and maximum between y and z.

Figure 11:
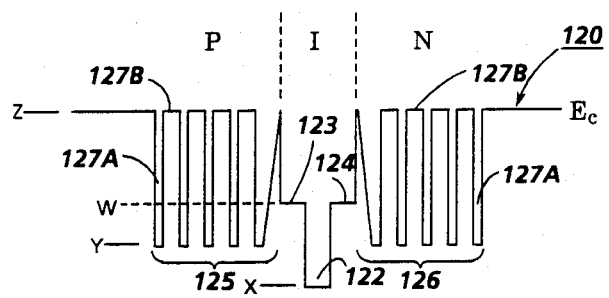
FIG. 11 is an energy band profile configuration for a separate confinement heterostructure (SCH) having superlattices in outer cladding regions.

In FIG. 11, there is illustrated an energy band profile configuration for a separate confinement heterostructure (SCH) structure 120 having superlattices (SL) 125 and 126 representing outer cladding regions. SCH SQW structure 120 comprises a central quantum well 122 bounded by inner cladding layers 123 and 124 providing for separate confinement followed by superlattices 125 and 126. Well 122 may be comprised of GaAs or $Ga_{1-x}Al_xAs$, where x is a small value and separate confinement layers 123 and 124 may comprise $Ga_{1-w}Al_wAs$. SL regions 125 and 126 comprise alternating cladding barriers 127B and wells 127A where the thickness, $L_B$, of barriers 127B is greater than the thickness, $L_A$, of wells 127A. Wells 127A have a compositional content of $Ga_{1-y}Al_yAs$ while barriers 127B have a compositional content of $Ga_{1-z}Al_zAs$ so that $z>w>y>x$. Superlattices 125 and 126 may also have a period wherein $L_A=L_B$ and a denser frequency, i.e. a shorter period, e.g., forty alternating layers of $Ga_{1-y}Al_yAs$ and $Ga_{1-z}Al_zAs$, where $L_A=L_B=20Å-60Å$.

Figure 12:
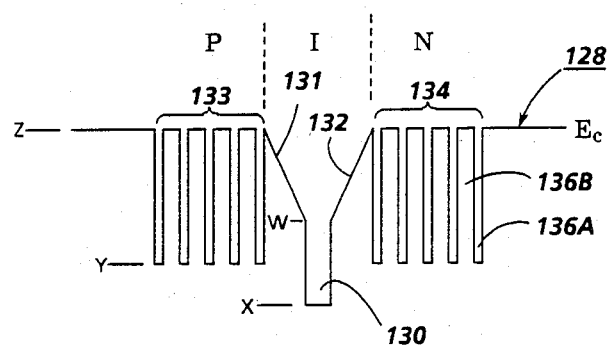
FIG. 12 is an energy band profile configuration for a linear graded index, separate confinement heterostructure (LIN GRIN SCH) SQW structure having superlattices in outer cladding regions.

In FIG. 12, there is illustrated an energy band profile configuration for a linear graded index, separate confinement heterostructure (LIN GRIN SCH) SQW structure 128. Structure 128 is similar in design to structure 120 in FIG. 11 except structure 128 has inner confinement regions 131 and 132 which monotonically graded compositional content. Well 130 may be comprised of GaAs on $Ga_{1-x}Al_xAs$, where x is s small value and LIN GRIN SCH regions 131 and 132 may be between minimum and maximum values from $Ga_{1-w}Al_wAs$ to $Ga_{1-z}Al_zAs$ where $z>w>x$. SL regions 133 and 134 comprise alternating cladding wells 136A. Wells 136B where the thickness, $L_B$, of barriers 136B is greater than the thickness, $L_A$, of wells 136A and wells 136A have a compositional content of $Ga_{1-y}Al_yAs$ while barriers 136B have a compositional content of $Ga_{1-z}Al_zAs$ so that $z>w>y>x$. Superlattices 133 and 134 may also have a period wherein $L_A=L_B$ and a denser frequency, i.e. a shorter period, e.g., forth alternating layers each of $Ga_{1-z}Al_zAs$, where $L_A=L_B=20Å-60Å$.

Figure 13:
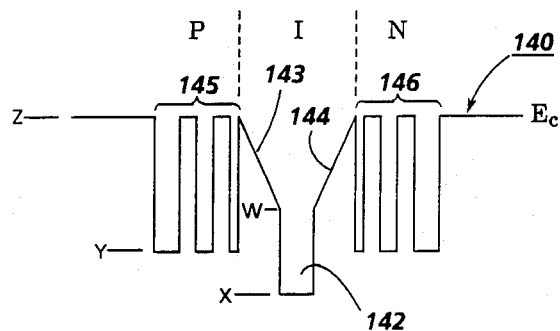
FIG. 13 is an energy band profile configuration for a linear graded index, separate confinement heterostructure (LIN GRIN SCH) SQW structure having thickness graded index superlattices (THCK GRIN SL) in outer cladding regions.

In FIG. 13, there is illustrated an energy band profile configuration for a linear graded index, separate confinement heterostructure (LIN GRIN SCH) SQW structure 140. Structure 140 is similar in design to structure 128 in FIG. 12 except structure 140 has outer cladding SL regions 145 and 146 of thickness graded index superlattices (THCK GRIN SL). Well 142 may be comprised of GaAs or $Ga_{1-x}Al_xAs$, where x is s small value and LIN GRIN SCH regions 143 and 144 may be between minimum and maximum values from $Ga_{1-x}Al_xAs$ to $Ga_{1-z}Al_zAs$ where $z>w>x$. SL regions 145 and 146 may have an increasing modulated period chance between minimum and maximum period values of M and N. SL regions 145 and 146 may also be provided with a larger modulated grading than that illustrated in FIG. 13. Alternatively, SL regions 145 and 146 may have a linear grading between minimum and maximum values from $Ga_{1-y}Al_yAs$ to $Ga_{1-z}Al_zAs$ with a modulated minimum and maximum between y and z and concurrently being linearly graded from a minimum value adjacent to separate confinement regions 143 and 144 to a maximum value at the outer limits, i.e., similar to SATH SL regions 84 and 86 in FIG. 7. As a further embodiment, a combination COMP GRIN and THCK GRIN may be utilized in SL regions 145 and 146 wherein the compositional content and well/barrier thickness both vary from minimum values to maximum values away from the SCH SQW regions 143 and 144 of structure 140.

Figure 14:
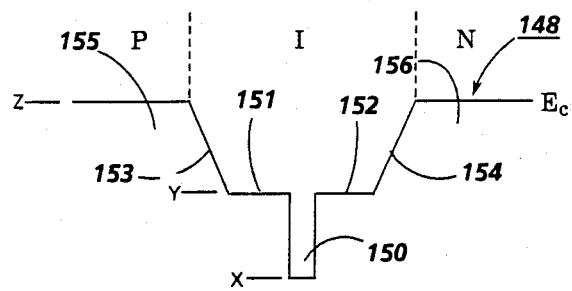
FIG. 14 is an energy band profile configuration for a hybrid linear graded index, separate confinement heterostructure (LIN GRIN SCH) SQW structure.

In FIG. 14, there is illustrated an energy band profile configuration for a hybrid linear graded index, separate confinement heterostructure (LIN GRIN SCH) SQW structure 148 comprising a quantum well 150 bounded by inner cladding layers 151 and 152, providing for separate confinement, with linearly graded index guides 153 and 154. Well 150 may be comprised of GaAs or $Ga_{1-x}Al_xAs$, where x is a small value and LIN GRIN SCH regions 153 and 154 which may be between minimum and maximum values from $Ga_{1-y}Al_yAs$ at layers 151 and 152 to $Ga_{1-z}Al_zAs$ at the outer extent of optical guide region 153 and 154 where $z>y>x$. Outer cladding layers 155 and 156 comprise $Ga_{1-z}Al_zAs$.

Figure 15:
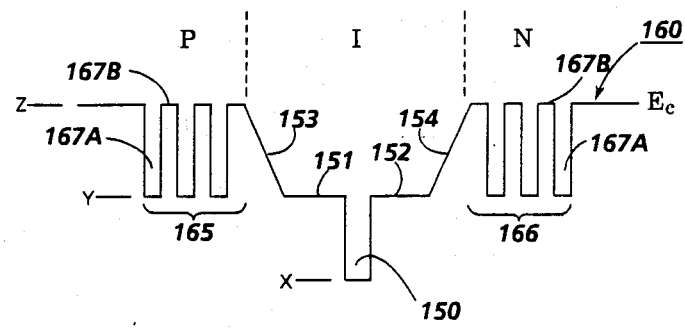
FIG. 15 is an energy band profile configuration for a hybrid linear graded index, separate confinement heterostructure (LIN GRIN SCH) SQW structure having superlattices in outer cladding regions.

In FIG. 15, there is illustrated an energy band profile configuration for structure 160, similar to the design of structure 148 shown in FIG. 14, so that corresponding elements of each of these structures carry the same numerical identifiers and the corresponding description is equally applicable. Outer cladding SL regions 165 and 166 of LIN GRIN SCH SQW structure 160, however, contain superlattices comprising alternating cladding wells 167A and cladding barriers 167B where $L_A=L_B$ and wells 167A have a compositional content of $Ga_{1-y}Al_yAs$ while barriers 167B have a compositional content of $Ga_{1-z}Al_zAs$ where $z>y>x$. SL regions 165 and 166 may also have a period where $L_A \neq L_B$ or have a denser frequency, i.e. a shorter period, e.g., forty alternating layers of $Ga_{1-y}Al_yAs$ and $Ga_{1-z}Al_zAs$ where, $L_A=L_B=20\text{Å}-60\text{Å}$.

The design of structure 160, as well as the structure designs of FIGS. 11–14, provide for beam width control characterized by output beams of narrow waist and small divergence, which parameters may be selected by changes in the extent of the superlattices and changes in varying compositional value provided in these structures providing high optical output power.

Figure 16:
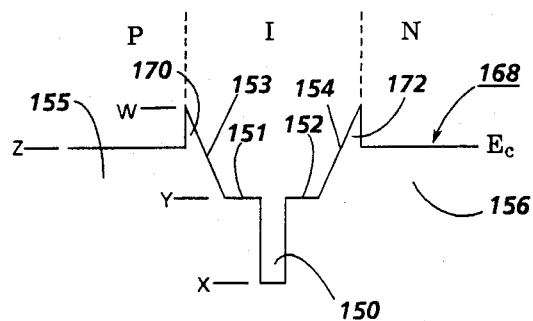
FIG. 16 is an energy band profile configuration for a hybrid linear graded index, separate confinement heterostructure (LIN GRIN SCH) SQW structure having sawtooth clad projections.

In FIG. 16, there is illustrated an energy band profile configuration for structure 168, which is similar to the design of structure 148 shown in FIG. 14 except for outer cladding barriers 170 and 172 to form a waveguiding mechanism. Corresponding elements of each of these structures, therefore, carry the same numerical identifiers and the corresponding description is equally applicable. Outer cladding barriers 170 and 172 of LIN GRIN SCH SQW structure 168 comprises regions of higher graded index value of $Ga_{1-w}AlAs$ than outer cladding regions 155 and 156 of $Ga_{1-z}Al_zAs$, i.e. $w>z>y>z$, to provide for optical wave confinement and narrow far field output beam.

Figure 17:
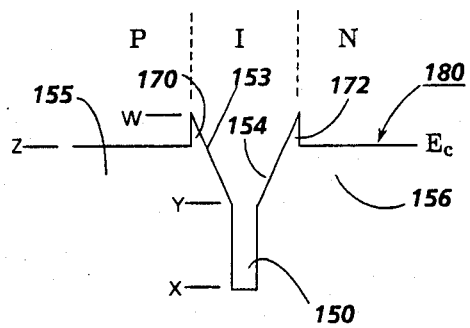
FIG. 17 is an energy band profile configuration for a linear graded index, separate confinement heterostructure (LIN GRIN SCH) SQW structure having sawtooth clad projections.

In FIG. 17, there is illustrated an energy band profile configuration for a structure 180, which is, similar in design of structure 168 shown in FIG. 16 except that inner confinement layers 151 and 152 are not present. Corresponding elements of each of these structures, therefore, carry the same numerical identifiers and the corresponding description is equally applicable. Outer layers 155 and 156 of structures 168 and 180 are of high Al content, e.g. preferably 60% to 80% Al content, but operatively 35% to 100%, so as to prevent antiwaveguiding.

Figure 18:
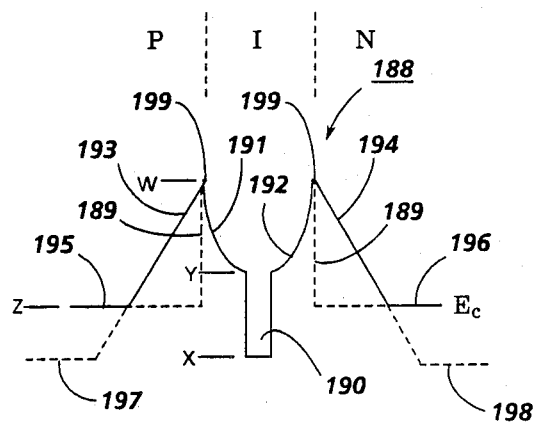
FIG. 18 is an energy band profile configuration for a hybrid parabolic graded index, separate confinement heterostructuure (PAR GRIN SCH) SQW structure.

In FIG. 18, there is illustrated an energy band profile configuration for a hybrid parabolic graded index, separate confinement heterostructure (PAR GRIN SCH) SQW structure 188 comprising quantum well 190 bounded on both sides by PAR GRIN layers 191 and 192 ending at apexes 199, followed by monotonically decreasing compositional value layers 193 and 194 and outer cladding layers 195 and 196. Well 190 may be comprised of GaAs or $Ga_{1-x}Al_xAs$, where x is a small value and PAR GRIN regions which parabolically vary between minimum and maximum values from $Ga_{1-y}Al_yAs$ to $Ga_{1-w}Al_wAs$ to apexes 199 and thence linearly vary between maximum and minimum values from $Ga_{1-w}Al_wAs$ at apexes 199 to outer cladding layers 195 and 196 of $Ga_{1-z}Al_zAs$ where $w>y>z>x$. Alternatively, LIN GRIN layers 193 and 194 may vary from $Ga_{1-w}Al_wAs$ to GaAs or $Ga_{1-x}Al_xAs$, as indicated by dotted lines 197 and 198 or may immediately drop from $Ga_{1-w}Al_wAs$ to $Ga_{1-z}Al_zAs$, as indicated by dotted lines 189. Structure 188 is similar to the structure shown in U.S. Pat. No. 4,512,022 except for the introduction of LIN GRIN layers 193 and 194 adjacent to the PAR GRIN SCH region of structure 188, i.e. there is an immediately or gradual drop in Al content from w to z. This improved structural design provides for higher optical output power with lower thermal resistance compared to the structure of this patent.

The remaining structures to be described in FIGS. 19–23 relate to various active regions which, for the majority cases, contain outer cladding regions having short period superlattices of alternating AlAs and GaAs in order to provide for better thermal conductivity than ternary GaAlAs per se resulting in a device that has higher optical power output and lower sensitivity to temperature changes over continuous operation.

Figure 19:
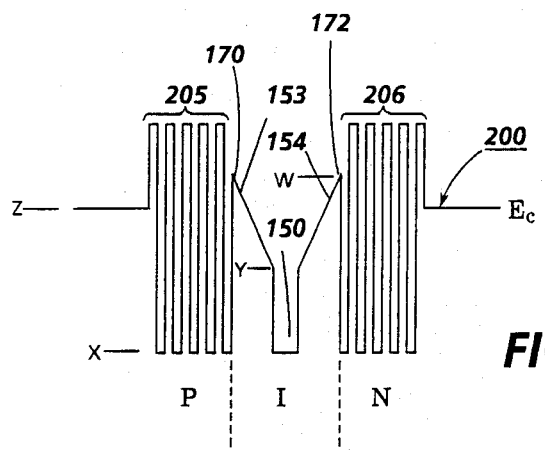
FIG. 19 is an energy band profile configuration for a linear graded index, separate confinement heterostructure (LIN GRIN SCH) SQW structure having short period superlattices in the cladding regions.

In FIG. 19, there is illustrated an energy band profile configuration for a linear graded index, separate confinement heterostructure (LIN GRIN SCH) SQW structure 200 having outer cladding regions 205 and 206 of short period superlattices, e.g., 30–100 alternating layers of GaAs and AlAs wherein the thickness of each of these layers may be, for example, in the range of 20Å–60Å. Other components of structure 200, i.e., central well 150 and LIN GRIN layers 153 and 154, are the same as corresponding components found in FIGS. 16 and 17 and, therefore, the corresponding description is equally applicable. The doping profile of the junction P-I-N is shown. With this profile injection into and capture of charge in the modulated cladding layers is eliminated. Such a structure is also required for any laser having such a modulated cladding layer. As previously indicated, such a structure may be also fabricated so that the modulated cladding layers are heavily doped and/or the well thickness in those layers be less (e.g., 20Å or less) than that of the well or wells in the p-n junction in the active region in order to avoid injection carrier capture in the modulated cladding layers. The P-I-N doping profile in FIG. 19 and others may be modified such that the "I" region may be reduced in width all the way to zero, if desired, or kept at the maximum width, as shown, or modified to be between zero and the maximum width shown.

The important feature of structure 200 is that outer SL regions 205 and 206 provide regions of a sufficient level of Al content to prevent antiwaveguiding but permitting the attainment of high power levels due to the lower thermal resistance and reduced electrical resistance provided by the lower alloy mixing as one moves from 50% composition mixture, i.e. $Ga_{0.5}Al_{0.5}As$, of alternating wells and barriers in SL regions 205 and 206.

Figure 20:
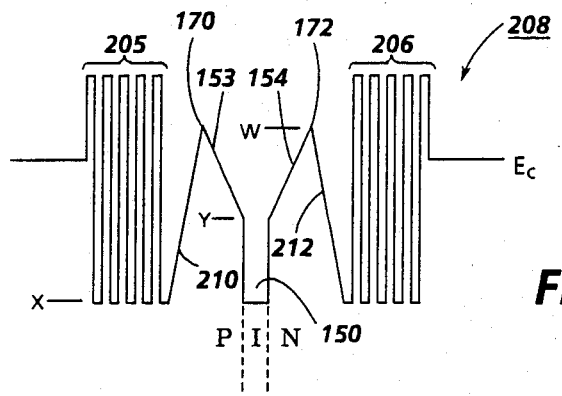
FIG. 20 is an energy band profile configuration for a hybrid linear graded index, separate confinement heterostructure (LIN GRIN SCH) SQW structure having short period superlattices in the cladding regions.

In FIG. 20, there is illustrated an energy band profile configuration for another LIN GRIN SCH SQW structure similar structure 200 in FIG. 19 except for LIN GRIN layers 210 and 212. Thus, corresponding elements of each of these structures carry the same numerical identifiers and the corresponding description is equally applicable. LIN GRIN layers 210 and 212 of structure monotonically decrease to 0 in Al content from w to x or x=0.

Figure 21:
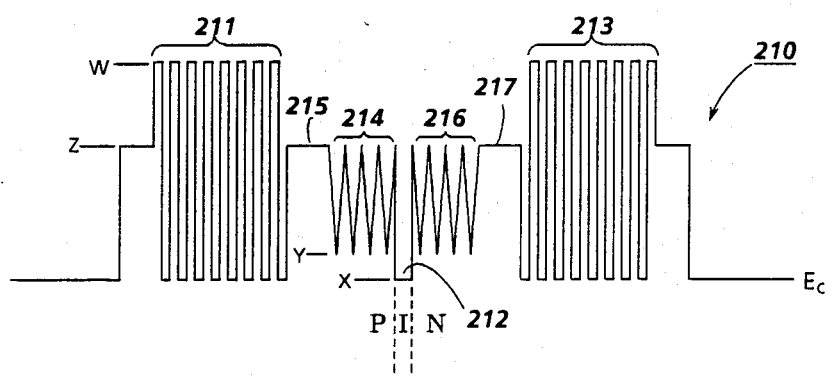
FIG. 21 is an energy band profile configuration for a SQW structure having sawtooth superlattices in inner cladding regions and superlattices in outer cladding regions.

In FIG. 21, there is illustrated an energy band profile configuration for a SQW structure 210 having sawtooth superlattices for inner cladding regions 214 and 216 and outer cladding SL regions 211 and 213 separated by intermediate layers 215 and 217 of small extent. Well 212 may be comprised of GaAs or $Ga_{1-x}Al_xAs$, where x is a small value and GRIN SATH SL waveguide regions 214 and 216 are a modulated grading in refractive index between maximum and minimum values of continually varying compositional content from $Ga_{1-y}Al_yAs$ to $Ga_{1-z}Al_zAs$ where $z>y>x$. Regions 214 and 216 are followed by intermediate cladding layers 215 and 217 of $Ga_{1-z}Al_zAs$ and thence followed by outer cladding SL regions 211 and 213 of short period superlattices, e.g. 30–100 alternating layers of GaAs and AlAs wherein the thickness of each of these layers may be in the range of 20Å–300Å.

Figure 22:
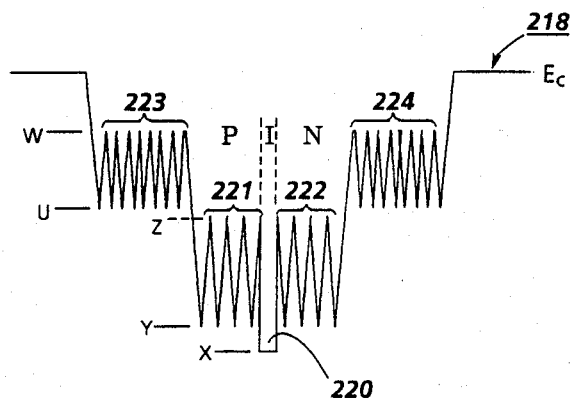
FIG. 22 is an energy band profile configuration for a double separate confinement sawtooth superlattice SQW structure having sawtooth superlattices in the inner and outer confinement regions.

In FIG. 22, there is illustrated an energy band profile configuration for a double separate confinement sawtooth superlattice SQW structure 218 having sawtooth superlattices in both inner cladding regions 221 and 222 and out cladding regions 223 and 224. Well 220 may be comprised of GaAs or $Ga_{1-x}Al_xAs$ where x is a small value. Sawtooth SL regions 221 and 222 are a modulated grading in refractive index between maximum and minimum values of varying compositional content from $Ga_{1-y}Al_yAs$ to $Ga_{1-z}Al_zAs$ where $z>y>x$. Sawtooth SL regions 223 and 224 are a modulated grading in refractive index between maximum and minimum values of varying compositional content from $Ga_{1-u}Al_uAs$ to $Ga_{1-w}Al_wAs$ where $w>u>z>y>x$.

Figure 23:
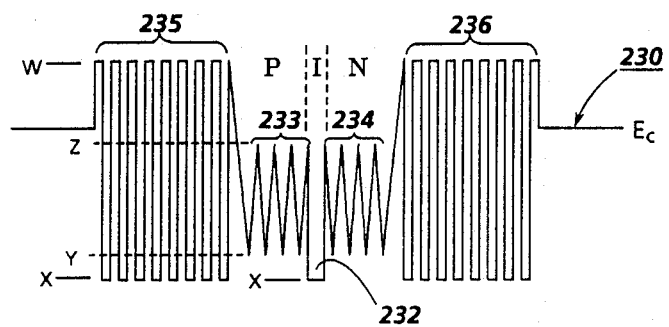
FIG. 23 is an energy band profile configuration for a separate confinement sawtooth superlattice SQW structure having short period superlattices in outer cladding regions.

In FIG. 23, there is illustrated an energy band profile configuration for a separate confinement sawtooth superlattice SQW structure 230 having short period superlattices in out cladding regions 235 and 236. Well 232 may be comprised of GaAs or $Ga_{1-x}Al_xAs$, where x is a small value and GRIN SATH SL waveguide regions 233 and 234 are modulated gradings in refractive index between maximum and minimum values of continually varying compositional content from $Ga_{1-y}Al_yAs$ to $Ga_{1-z}Al_zAs$ where $z>y>x$. SL regions 235 and 236 are comprised of short period superlattices, e.g. 30–100 alternating layers of GaAs and AlAs where the thickness of each of these layers may be in the range of 20Å–300Å. SL regions 235 and 236, as well as comparable SL regions in FIGS. 19–22, to wit, respectively regions 205, 206; 211, 213; and 223 and 224, provide a sufficient level of Al content to prevent antiwaveguiding but permitting the attainment of high output power levels due to the lower thermal resistance provided by the inclusion of these SL regions. Furthermore, series resistance of the layers can be reduced relative to layers that must have a composition near the direct/indirect bandgap crossover.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a quantum well heterostructure laser exhibiting low current density threshold and high $T_0$ values, said laser comprising
   a plurality of contiguous semiconductor layers formed on a substrate,
   one or more said layers forming an active region capable of quantization of electron states,
   said active region confined by a pair of outer superlattice regions providing optical confinement and low thermal resistance while preventing the development of antiwaveguiding properties.

2. The quantum well heterostructure laser of claim 1 wherein said outer superlattice regions have a modulated grading in compositional value between minimum and maximum values, the transition energy levels of said outer superlattice regions being higher than the lowest transition energy levels exhibited by said active region.

3. The quantum well heterostructure laser of claim 2 wherein said outer superlattice regions have a high period of frequency in said modulated grading comprising alternating layers of wells and barriers wherein each layer has a thickness in the range of 20Å–300Å.

4. The quantum well heterostructure laser of claim 2 wherein said outer superlattice regions are sawtooth shaped having a modulated grading in refractive index between maximum and minimum values of continually varying compositional content while simultaneously linearly graded in overall refractive index via a monotonic compositional change from a minimum value adjacent said active region to a maximum value at the outer limits of said outer cladding layers.

5. The quantum well heterostructure laser of claim 2 wherein said outer superlattice regions are linearly graded in overall refractive index via a monotonic compositional change from a minimum value adjacent said active region to a maximum value at the outer limits of said outer cladding layers.

6. The quantum well heterostructure laser of any one of the claims 1 through 5 wherein said active region comprises a single quantum well.

7. The quantum well heterostructure laser of any one of the claims 1 through 5 wherein said active region comprises a multiple quantum well.

8. The quantum well heterostructure laser of claim 7 wherein said multiple quantum well is a superlattice having a sawtooth shaped with a modulated grading in refractive index between maximum and minimum values of continually varying compositional content.

9. In a quantum well heterostructure laser exhibiting reduced thermal and electrical resistance and high $T_0$ value, said laser comprising:
   (a) a plurality of contiguous semiconductor layers formed on this substrate,
   (b) one or more of said layers comprising a well or wells forming an active region capable of quantization of electron states,
   (c) superlattice cladding regions adjacent either side of said active region comprising modulated wells and barrier layers wherein said modulated layers are doped an/or thickness of said cladding layers are less than the thickness of said active region well or wells.

10. The quantum well heterostructure laser of claim 9 wherein said cladding layer thicknesses are optimized for resident phonon effect.

11. The quantum well heterostructure laser of claim 9 wherein said cladding regions and active region comprise a P-I-N profile.

12. The quantum well heterostructure laser of claim 9 wherein said cladding regions comprise compositional sawtooth shaped superlattices.

13. The quantum well heterostructure laser of claim 9 wherein said cladding regions comprise compositional graded index sawtooth superlattices.

14. The quantum well heterostructure laser of claim 9 wherein said cladding regions comprise thickness graded index sawtooth superlattices.

15. The quantum well heterostructure laser of claim 9 wherein said active region comprises a compositional graded superlattice.

16. The quantum well heterostructure laser of claim 9 wherein said active region comprises a linear graded index, separate confinement heterostructure.

* * * * *